United States Patent
Chung

(10) Patent No.: US 6,809,018 B2
(45) Date of Patent: Oct. 26, 2004

(54) DUAL SALICIDES FOR INTEGRATED CIRCUITS

(75) Inventor: Henry Wei-Ming Chung, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/192,519

(22) Filed: Jul. 11, 2002

(65) Prior Publication Data

US 2004/0009652 A1 Jan. 15, 2004

(51) Int. Cl.[7] .................. H01L 21/3205; H01L 21/4763
(52) U.S. Cl. ........................ 438/592; 438/614
(58) Field of Search ................. 438/180, 229, 438/259, 301, 325, 364, 592, 605, 614

(56) References Cited

U.S. PATENT DOCUMENTS 5,897,348 A * 4/1999 Wu 6,268,251 B1 * 7/2001 Zhong et al.

* cited by examiner

Primary Examiner—Phuc T. Dang
(74) Attorney, Agent, or Firm—Dickinson Wright PLLC

(57) ABSTRACT

A method of forming dual salicides for integrated circuits. A mask layer is formed over a substrate having a first transistor and a second transistor thereon. The top surface of the first transistor's gate is higher than that of the second transistors' gate. The mask layer is patterned to expose the top surface of the second transistor's gate, source and drain. First metal suicides are formed respectively on the top surfaces of the second transistor's gate, source and drain. A dielectric layer is formed over the substrate, and the top surface of the dielectric layer is higher than that of the first transistor's gate. The dielectric layer, higher than the top surface of the second transistor's gate, is removed to expose the top surfaces of the first and the second transistors' gates. A second metal silicide is formed on the top surface of the first transistor's gate.

18 Claims, 4 Drawing Sheets

DUAL SALICIDES FOR INTEGRATED CIRCUITS

BACKGROUND

1. Field of Invention

The present invention relates to a fabrication method of integrated circuits. More particularly, the present invention relates to a method of dual salicide (self-aligned silicide) for integrated circuits.

2. Description of Related Art

For an integrated circuit composed of memory and logic circuits on one chip, meeting the different electrical requirements of memory and logic circuits at the same time while increasing the number of photo-mask used to a minimum extent are two important technical issues in the fabrication of semiconductor integrated circuits. For transistors in the memory region, current leakage is the most important problem that needs to be avoided, because it will increase the refresh frequency to decrease the memory efficiency. Therefore, decreasing sheet resistance of the transistors' source/drain is less important than avoiding the current leakage of the transistors' source/drain. However, for transistors in the logic region, the operation speed is the most important requirement. Therefore, decreasing the sheet resistance of the transistors' source/drain is very important.

How to effectively make use of the self-aligned silicide (abbreviated as salicide) process to selectively form metal silicide respectively on transistors' gates, sources and drains to meet the different requirements of memory and logic circuits is a problem that needs to be solved. Usually, metal silicide ($M_xSi_y$) possesses much lower resistance than doped silicon. Furthermore, the salicide process has been developed to form metal silicide only on the silicon's surface. Thus, the salicide process is usually used to decrease the resistance of both the polysilicon gate and the source/drain.

SUMMARY

The invention provides a method of forming dual salicides for integrated circuits. A mask layer is formed over a substrate having a first transistor, a second transistor and a third transistor thereon. The top surface of the first transistor's gate is higher than those of the second and the third transistors' gates. The mask layer is patterned to expose the top surface of the second transistor's gate, source and drain. First metal silicides are formed respectively on the top surfaces of the second transistor's gate, source and drain. A dielectric layer is formed over the substrate, and the top surface of the dielectric layer is higher than that of the first transistor's gate. The dielectric layer higher than the top surfaces of the second and the third transistors' gates is removed to expose the top surfaces of the first, the second and the third transistors' gates. Second metal silicides are formed respectively on the top surfaces of the first and the third transistors' gates.

The invention also provides another method of forming dual salicides for integrated circuits. A mask layer is formed over a substrate having a first transistor, a second transistor and a third transistor thereon. The top surface of the first transistor's gate is higher than those of the second and the third transistors' gates. The mask layer is patterned to expose the top surface of the second transistor's gate, source and drain. First metal silicides are formed respectively on the top surfaces of the second transistor's gate, source and drain. A dielectric layer is formed over the substrate, and the top surface of the dielectric layer is higher than that of the first transistor's gate. The dielectric layer that is higher than the top surfaces of the second and the third transistors' gates is removed to expose the top surfaces of the first, the second and the third transistors' gates. A second mask layer is formed over the substrate. The second mask layer is patterned to expose the top surface of the first transistor gate. A second metal silicide is formed on the top surface of the first transistor's gate.

The first transistor can be located in, for example, the memory region, and the second and the third transistors can be located in, for example, the logic region. The first and the second metal silicides are, for example, titanium silicide, cobalt silicide or nickel silicide. The dielectric layer high than the top surfaces of the second and the third transistors' gates is removed by, for example, chemical mechanical polishing and etching back.

As embodied and broadly described herein, the invention provides a method of separately forming metal silicides on different transistors' gates, sources and drains. Therefore, the optimum requirement of transistors on different regions can be met.

It is to be understood that both the foregoing general description and the following detailed description are examples only, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

FIGS. 1A–1D are schematic, cross-sectional views showing a fabrication process of dual salicides for integrated circuits according to one preferred embodiment of this invention.

Figure 1A:
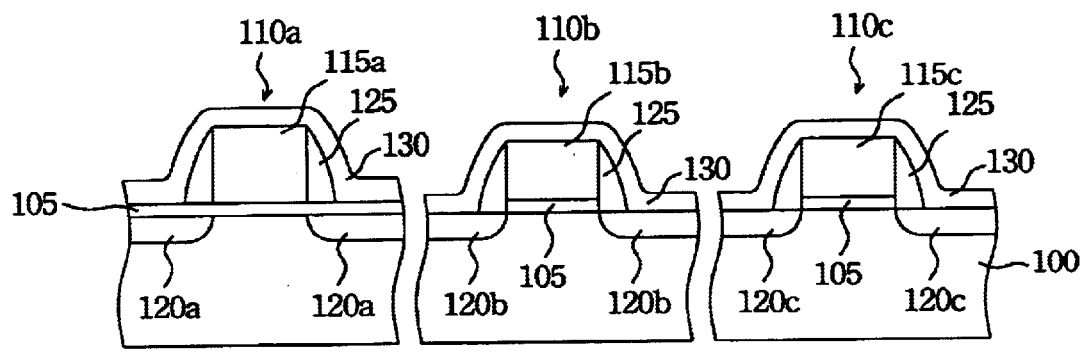
FIGS. 1A–1D are schematic, cross-sectional views showing a fabrication process of dual salicides for integrated circuits according to one preferred embodiment of this invention.

In FIG. 1A, gate oxides 105 axe formed on a substrate 100 by thermal oxidation. Transistors 110a, 110b and 110c respectively are composed of gates 115a, 115b, and 115c and sources/drains 120a, 120b, 120c are successively formed on the substrate 100 on different regions, and the top surface of the gate 115a is slightly higher than that of the gates 115b and 115c. The material of the gates 115a, 115b, and 115c is polysilicon. Spacers 125 are subsequently formed on the sidewalls of the gates 115a, 115b, and 115c. Then a mask layer 130 is conformably formed on the substrate 100 by chemical vapor deposition, and the material of the mask layer 130 can be, for example, silicon oxide.

Figure 1B:
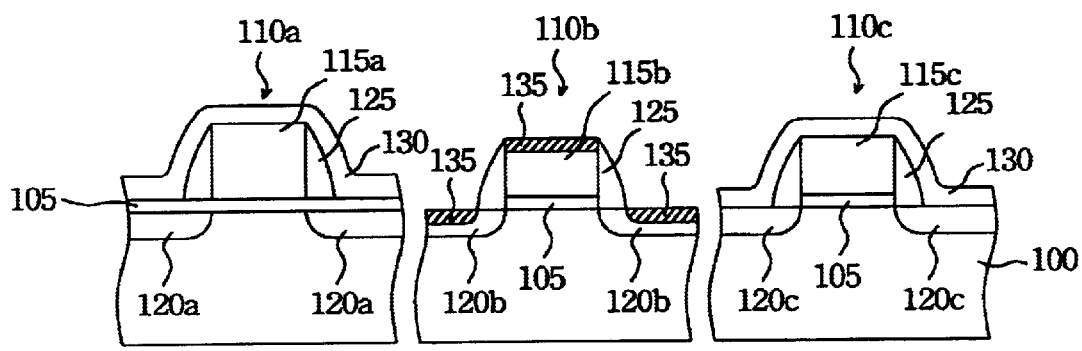

In FIG. 1B, the mask layer 130 is patterned by photolithography and etching to expose the region where the gate 115b is located. A salicide process is performed to form metal silicides 135 on the surface of the gate 115b and the source/drain 120b. The metal silicides 135 can be, for example, titanium silicide, cobalt silicide or nickel silicide.

Figure 1C:
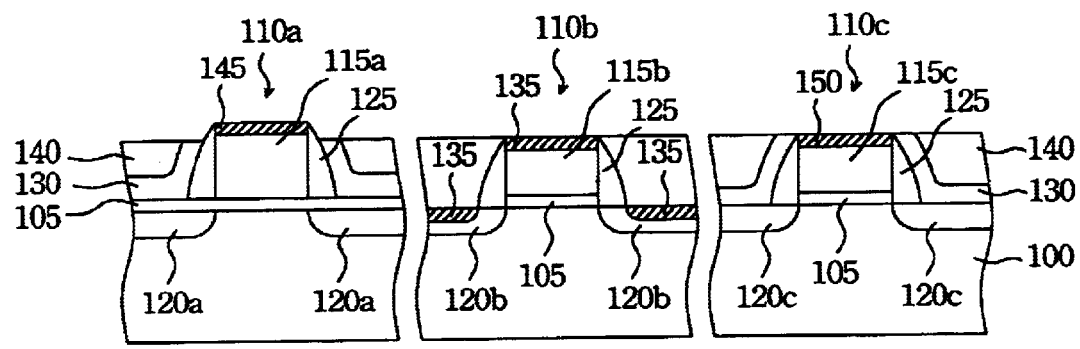

In FIG. 1C, a dielectric layer 140 is formed over the substrate 100, and its thickness is larger than the height of the gate 115a. The material of the dielectric layer 140 is, for example, silicon oxide formed by high-density plasma chemical vapor deposition (HDPCVD). Then the dielectric layer 140 higher than the top surface of the gates 115b and 115c is removed by chemical mechanical polishing then etching back to expose the surface of the gates 115a, 115b and 115c. Metal silicides 145 and 150 are formed on the surface of the gates 115a and 115c, and the material of the metal silicides 145 and 150. Similarlly, metal silicides 145 and 150 can be titanium silicide, cobalt silicide or nickel silicide.

Figure 1D:
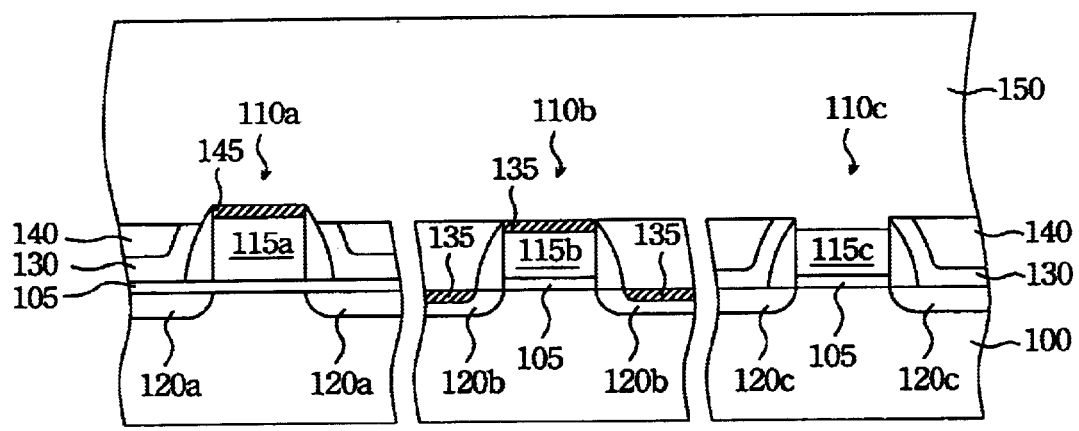

In FIG. 1D, a photoresist layer (not shown in FIG. 1D) is formed over the substrate 100, and then it is patterned to expose the surface of the metal silicide 150. The metal silicide 150 and the photoresist layer are successively removed. A dielectric layer 150 is formed over the substrate 100, and the material of the dielectric layer 150 is, for example, silicon oxide formed by plasma enhanced chemical vapor deposition (PECVD). The subsequent processes are familiar to persons skilled in this art, and thus it is omitted here.

Figure 2A:
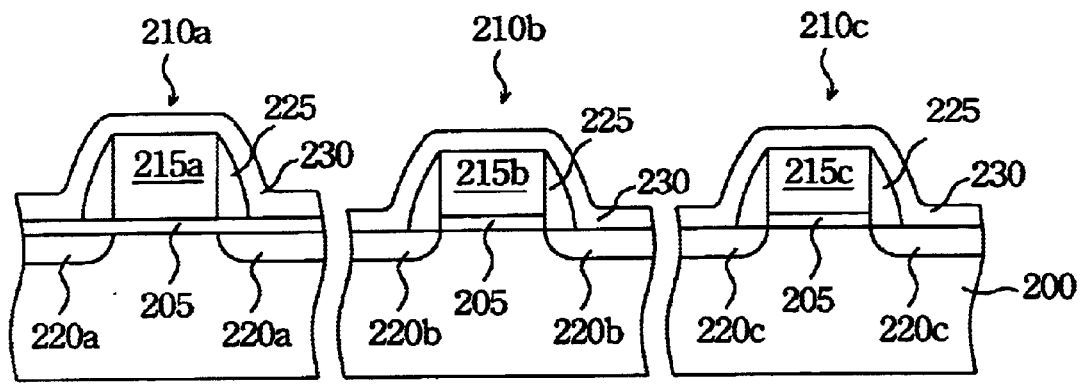
FIGS. 2A–2C are schematic, cross-sectional views showing a fabrication process of dual salicides for integrated circuits according to another preferred embodiment of this invention.
Figure 2B:
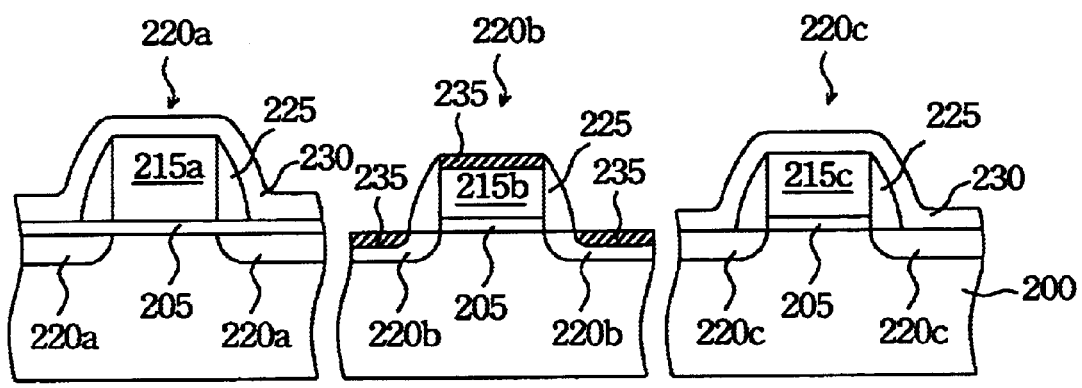
Figure 2C:
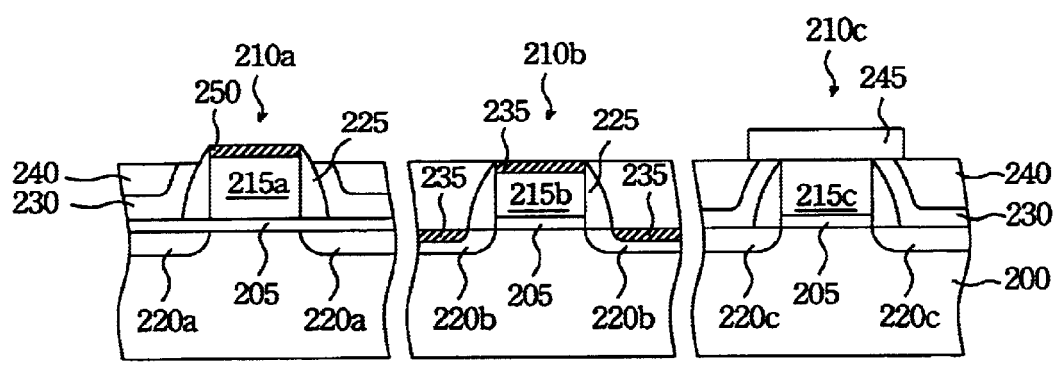

There is another way to achieve the same result as shown in FIG. 1D. FIGS. 2A–2C are schematic, cross-sectional views showing a fabrication process of dual salicides for integrated circuits according to another preferred embodiment of this invention.

The processes done in FIGS. 2A and 2B are similar to FIGS. 1A and 1B, and the numbers which are 100 larger than those in FIGS. 1A and 1B have the same meaning as those in FIGS. 1A and 1B, and therefore those processes are omitted here.

In FIG. 2C, a dielectric layer 240 is formed on the substrate 200, and the material of the dielectric layer 240 can be, for example, silicon oxide formed by HDPCVD. Then the dielectric layer 240 higher than the top surface of the gates 215b and 215c is removed by, for example, chemical mechanical polishing and then etching back to expose the top surface of the gates 215a, 215b and 215c.

Another mask layer 245 is formed over the substrate 200, and then it is patterned to cover the gate 215c only. The mask layer 245 is, for example, a silicon oxide layer formed by chemical vapor deposition. Metal silicide 250 is subsequently formed on the gate 215a by salicide process, and the metal silicide 250 can be titanium silicide, cobalt silicide or nickel silicide. Similarly, the metal silicide 145 is only formed on the gate 115a of the transistor 110a, and the metal silicides 135 are formed on the surface of the gate 115b and source/drain 120b of the transistor 110b. As for the transistor 110c, there is no metal silicide formed on the surface of its gate and source/drain. The subsequent processes are familiar by persons skilled in this art, and thus it is omitted here.

The transistors 110a and 210a are located in, for example, the memory regions. The transistors 110b, 110c, 210b and 210c are located in, for example, the logic regions. Therefore, as described above, the metal silicides 145 and 250 are only formed on the gate 115a and 215a of the transistor 110a and 210a to meet the requirement of lowering the refresh frequency of the memory. The metal silicides 135 and 235 are formed on the surface of the gate 115b and 215b and source/drain 120b and 220b of the transistor 110b and 210b to meet the requirement of increasing the operation speed for the logic circuits. As for another requirement that does not form metal silicide on the transistor's gate, source and drain, there is no metal silicide formed on the surface of its gate and source/drain of transistor 110c and 210c.

Since the photolithography determines the pattern of each thin film and the doped region, it is the most important step of the semiconductor processes. The photolithography or photomask's number needed usually determines the difficulty and complexity of a semiconductor process. In FIG. 1C, this invention utilizes the small height difference between gate 115a and gates 115b and 115c to omit one photolithography step, that is, a photomask is omitted in this process. Therefore, the production cost can be greatly reduced and the yield can be greatly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming dual salicides for integrated circuits, comprising:

forming a mask layer over a substrate having a first transistor, a second transistor and a third transistor thereon, and the top surface of the first transistor's gate being higher than those of the second and the third transistors' gates;

patterning the mask layer to expose the top surface of the second transistor's gate, source and drain;

forming a first metal silicide respectively on the top surfaces of the second transistor's gate, source and drain;

forming a dielectric layer over the substrate, the top surface of the dielectric layer being higher than that of the first transistor's gate;

removing a portion of the dielectric layer higher than the top surfaces of the second and the third transistors' gates to expose the top surfaces of the first, the second and the third transistors' gates; and forming a second metal silicide respectively on the top surfaces of the first and third transistors' gates.

2. The method of claim 1, wherein the removing step is performed by chemical mechanical polishing and etching back.

3. The method of claim 1, wherein the first transistor is on the memory region.

4. The method of claim 1, wherein the second and the third transistors are on the logic region.

5. The method of claim 1, wherein the first and the second metal suicides are selected from the group consisting of titanium suicide, cobalt suicide and nickel suicide.

6. The method of claim 1, wherein the dielectric layer comprises a silicon oxide layer deposited by high-density plasma chemical deposition.

7. The method of claim 1, which further comprises:

forming a photoresist layer on the substrate;

patterning the photoresist layer to expose the second metal suicide on the third transistor's gate; and removing the exposed second metal suicide.

8. A method of forming dual salicides for integrated circuits, comprising:

forming a mask layer over a substrate having a first transistor, a second transistor and a third transistor thereon, and the top surface of the first transistor's gate being higher than those of the second and the third transistors' gates;

patterning the mask layer to expose the top surface of the second transistor's gate, source and drain;

forming a first metal silicide respectively on the top surfaces of the second transistor's gate, source and drain;

forming a dielectric layer over the substrate, the top surface of the dielectric layer being higher than that of the first transistor's gate;

removing a portion of the dielectric layer higher than the top surfaces of the second and the third transistors' gates to expose the top surfaces of the first, the second and the third transistors' gates;

forming a second mask layer over the substrate;

patterning the second mask layer to expose the top surface of the first transistor's gate; and forming a second metal suicide on the top surface of the first transistor's gate.

9. The method of claim 8, wherein the removing step is performed by chemical mechanical polishing and etching back.

10. The method of claim 8, wherein the first transistor is on the memory region.

11. The method of claim 8, wherein the second and the third transistors are on the logic region.

12. The method of claim 8, wherein the first and the second metal suicides are selected from the group consisting of titanium suicide, cobalt suicide and nickel suicide.

13. The method of claim 8, wherein the dielectric layer comprises a silicon oxide layer deposited by high-density plasma chemical deposition.

14. A method of forming dual salicides for integrated circuits, comprising:

forming a mask layer over a substrate having a first transistor and a second transistor thereon, and the top surface of the first transistor's gate being higher than that of the second transistor's gate;

patterning the mask layer to expose the top surface of the second transistor's gate, source and drain;

forming a first metal silicide respectively on the top surfaces of the second transistor's gate, source and drain;

forming a dielectric layer over the substrate, the top surface of the dielectric layer being higher than that of the first transistor's gate;

removing a portion of the dielectric layer higher than the top surfaces of the second transistor's gate by chemical mechanical polishing and then etching back to expose the top surfaces of the first and the second transistors' gates; and forming a second metal suicide on the top surface of the first transistor's gate.

15. The method of claim 14, wherein the first transistor is on the memory region.

16. The method of claim 14, wherein the second transistor is on the logic region.

17. The method of claim 14, wherein the first and the second metal suicides are selected from the group consisting of titanium suicide, cobalt suicide and nickel silicide.

18. The method of claim 14, wherein the dielectric layer comprises a silicon oxide layer deposited by high-density plasma chemical deposition.

* * * * *